United States Patent
Tsai

(10) Patent No.: US 12,412,791 B2
(45) Date of Patent: Sep. 9, 2025

(54) LIQUID-TIGHT STRUCTURE WITH A FASTENER COMPONENT

(71) Applicant: DELL PRODUCTS L.P., Round Rock, TX (US)

(72) Inventor: Po-Cheng Tsai, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 227 days.

(21) Appl. No.: 18/151,833

(22) Filed: Jan. 9, 2023

(65) Prior Publication Data
US 2024/0237281 A1    Jul. 11, 2024

(51) Int. Cl.
| | | |
|---|---|---|
| H01L 23/04 | (2006.01) |
| F16J 15/02 | (2006.01) |
| F16L 23/00 | (2006.01) |
| H01L 23/40 | (2006.01) |
| H05K 7/20 | (2006.01) |

(52) U.S. Cl.
CPC ............ *H01L 23/04* (2013.01); *F16J 15/021* (2013.01); *F16L 23/00* (2013.01); *H01L 23/4006* (2013.01); *H05K 7/20272* (2013.01)

(58) Field of Classification Search
None
See application file for complete search history.

(56) References Cited

U.S. PATENT DOCUMENTS

| | | | |
|---|---|---|---|
| 7,527,300 B2* | 5/2009 | Li | F16L 33/223 |
| | | | 285/332 |
| 9,699,938 B2 | 7/2017 | Shelnutt et al. | |
| 10,168,110 B2* | 1/2019 | Krug, Jr. | B21D 53/02 |
| 10,863,652 B1* | 12/2020 | Conroy | H05K 7/20763 |
| 11,092,269 B2* | 8/2021 | Kujawski, Jr. | F16L 21/06 |
| 12,111,000 B2* | 10/2024 | Nowicki | F16L 37/16 |
| 2013/0312854 A1* | 11/2013 | Eriksen | F16L 37/32 |
| | | | 137/544 |
| 2020/0049429 A1* | 2/2020 | Koontz | H01L 23/4006 |
| 2020/0378858 A1 | 12/2020 | Curtis et al. | |
| 2022/0095481 A1 | 3/2022 | Ma et al. | |
| 2024/0039186 A1* | 2/2024 | Su | H01R 4/70 |

* cited by examiner

*Primary Examiner* — Courtney L Smith
(74) *Attorney, Agent, or Firm* — Larson Newman, LLP

(57) ABSTRACT

A liquid-tight structure includes a stepped fastener having a first shank and a second shank. The stepped fastener is threadingly engaged with an opening that includes a first step and a second step. A first diameter of the first shank is larger than a second diameter of the second shank. The liquid-tight structure includes a first seal seated on and in physical communication with a first top surface of the first step of the opening. The first seal is compressed between a first side of the opening and the first shank. The liquid-tight structure includes a second seal seated on and in physical communication with a second top surface of the second step of the opening. The second seal is compressed between a second side of the opening and the second shank.

20 Claims, 4 Drawing Sheets

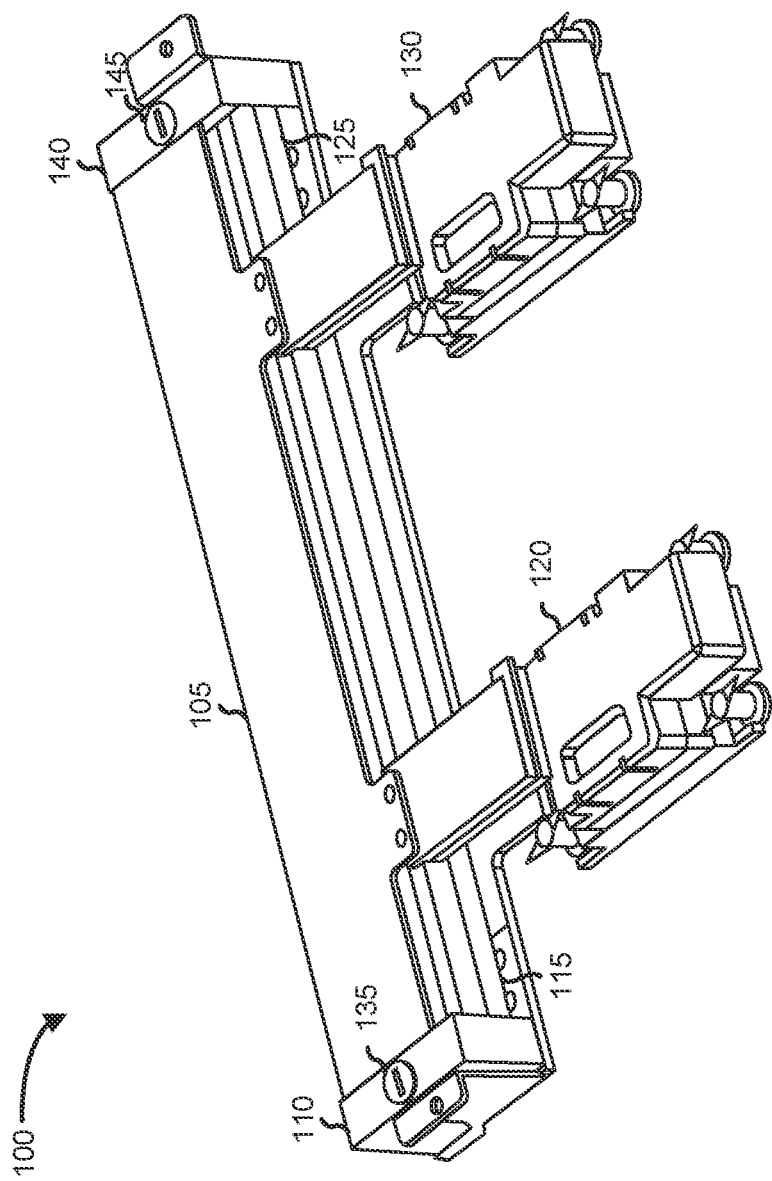
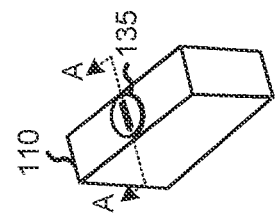
FIG. 1
FIG. 2

LIQUID-TIGHT STRUCTURE WITH A FASTENER COMPONENT

FIELD OF THE DISCLOSURE

The present disclosure generally relates to information handling systems, and more particularly relates to a liquid-tight structure with a fastener component for an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A liquid-tight structure has a stepped fastener that includes a first shank and a second shank. The stepped fastener is threadingly engaged with an opening that includes a first step and a second step. The first diameter of the first shank may be larger than a second diameter of the second shank. The liquid-tight structure includes a first seal seated on and in physical communication with a first top surface of the first step of the opening. The first seal is compressed between a first side of the opening and the first shank. The liquid-tight structure includes a second seal seated on and in physical communication with a second top surface of the second step of the opening. The second seal is compressed between a second side of the opening and the second shank.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 1 is a perspective view illustrating a liquid-based cooler according to an embodiment of the present disclosure;

FIG. 2 is a perspective view illustrating a coolant reservoir which is a liquid-tight structure with a fastener component, according to an embodiment of the present disclosure

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

As processors, graphics cards, random access memory, and other components of an information handling system have increased in clock speed and power consumption, the amount of heat produced by such components during normal operation has also increased. Often, the temperatures of these components need to be kept within a reasonable range to prevent overheating, instability, malfunction, and damage leading to a shortened component lifespan. Accordingly, liquid-based coolers, such as a liquid air assistant cooling module or similar have been used to accelerate heat dissipation. However, one disadvantage to using liquid-based coolers is that a coolant reservoir may leak over time. As such, a liquid-tight coolant reservoir is disclosed herein to prevent or eliminate the risk of fluid leaking from a liquid-based cooler.

Figure 5:
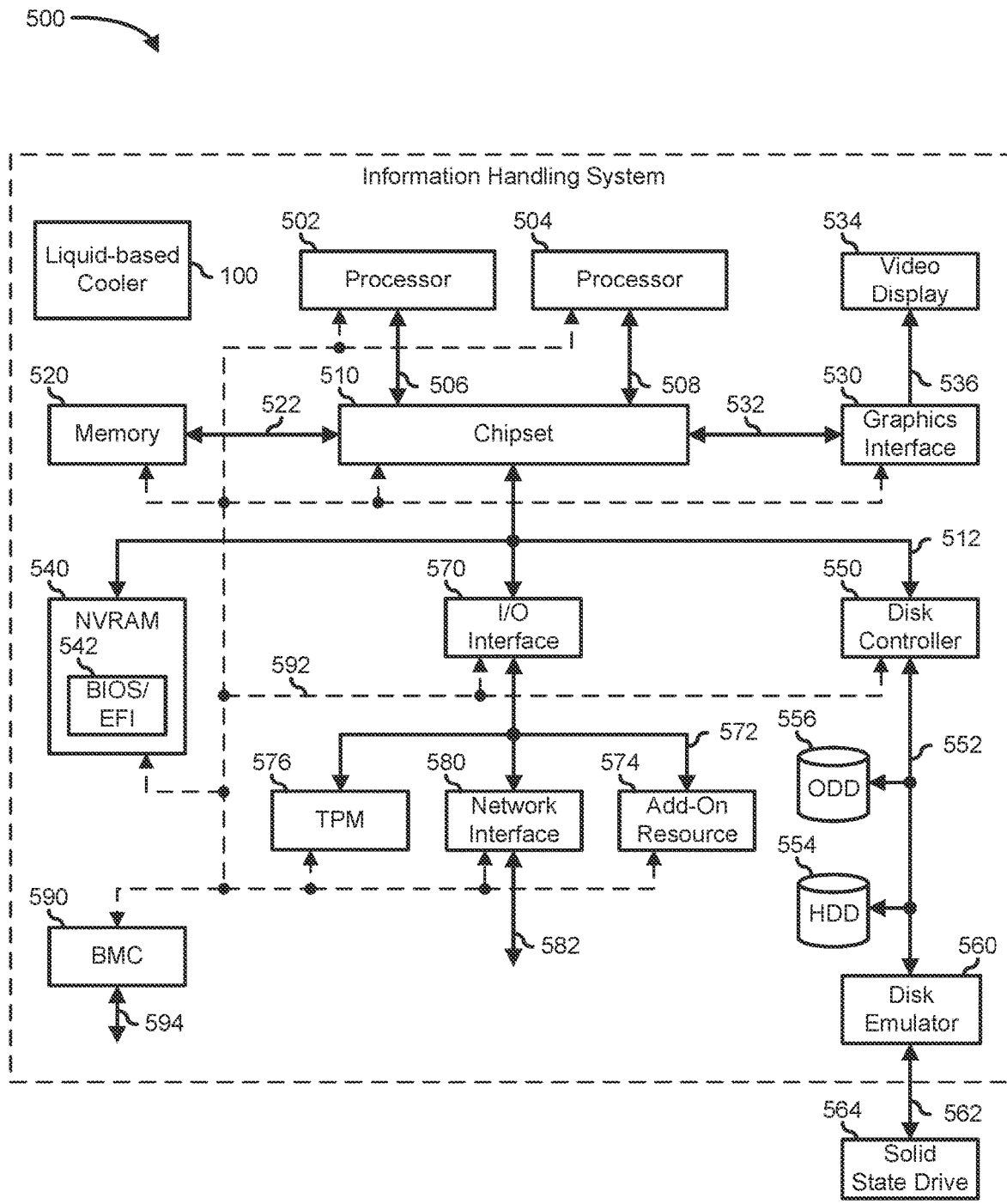
FIG. 5 is a block diagram illustrating an information handling system according to an embodiment of the present disclosure.

FIG. 1 shows a liquid-based cooler 100 for cooling an information handling system, such as information handling system 500 of FIG. 5. Liquid-based cooler 100, also referred to as a liquid cooling system, includes a radiator 105, a coolant reservoir 110, a tube 115, a pump 120, a tube 125, a pump 130, and a coolant reservoir 140. Pumps 120 and 130 may be coupled to tubes 115 and 125 and may include any mechanical or electro-mechanical system, apparatus, or device operable to produce a flow of fluid. For example, pumps 120 and 130 may provide fluid flow by applying pressure to coolant in tubes 115 and 125. The functions and features of a liquid-based cooler 100 are known in the art and will not be further disclosed herein, except as needed to illustrate the various embodiments disclosed herein. The components shown are not drawn to scale and liquid-based cooler 100 may include additional or fewer components. In addition, connections between components may be omitted for descriptive clarity.

Radiator 105 may include any device, system, or apparatus configured to transfer thermal energy from one medium, such as coolant in coolant reservoir 110, to another for cooling and heating. In some embodiments, radiator 105 may include channels and/or conduits, such as tubes 115 and 125, and pumps 120 and 130. Radiator 105 includes coolant reservoirs 110 and 140 that are filled with coolant fluid. The coolant fluid, such as water, betaine, deionized water, or similar, is driven by pumps 120 and 130 to pass through a cold plate via tubes 115 and 125 and back to the radiator to cool down.

Coolant reservoir 110 may include a coolant inlet to fill the reservoir with coolant fluid. Coolant reservoir 110 is a liquid-tight or watertight structure with a coolant inlet that uses a fastener 135 to prevent the coolant fluid from leaking out. Fastener 135 may be a stepped fastener, such as a stepped screw that may be used with a seal such as an "O-ring." The seal may be constructed of any suitable material and formed in any suitable shape. The seal may be used to prevent the coolant fluid from leaking out around fastener 135 as liquid leaks within the information handling system may cause damage. For example, the fluid leak may cause corrosion to components of the information handling system and or damage to the electrical or electronic circuitry of the information handling system. However, the quality of the tolerance of the O-ring is hard to control and is typically imprecise due to inconsistent manufacturing processes. This affects the liquid-tight compression value of the O-ring making the liquid-tight seal of the screw unreliable. Accordingly, to address this and other concerns, an improved liquid-tight structure with a fastener and seal combination is disclosed herein. Coolant reservoir 140 is similar to coolant reservoir 110. Accordingly, coolant reservoir 140 includes a fastener 145 which is similar to fastener 135. Thus, although the descriptions herein are disclosed using coolant reservoir 110 and fastener 135, such descriptions are also applicable to coolant reservoir 140 and fastener 145.

Those of ordinary skill in the art will appreciate that the configuration of the liquid-based cooler depicted in FIG. 1 and coolant reservoir 110 in FIG. 2 may vary. For example, the illustrative components within liquid-based cooler 100 and coolant reservoir 110 are not intended to be exhaustive, but rather are representative to highlight components that can be utilized to implement aspects of the present disclosure. For example, other devices and/or components may be used in addition to or in place of the devices/components depicted. The depicted example does not convey or imply any architectural or other limitations with respect to the presently described embodiments and/or the general disclosure. For example, although coolant reservoir 110 is shown to be rectangular, those of ordinary skill in the art will appreciate that coolant reservoir 110 is not limited to such a shape. Accordingly, coolant reservoir 110 may be square, round, cylindrical, etc. Further, embodiments of the present disclosure do not only apply to coolant reservoirs but to any liquid reservoir wherein providing leak-proof functionality is needed or desired. In addition, although coolant reservoir 110 is shown as part of a liquid-based cooler, the leak-proof structure may be included in other systems wherein liquid contained in a leak-proof structure is needed or desired. In the discussion of the figures, reference may also be made to components illustrated in other figures for the continuity of the description.

Figure 3:
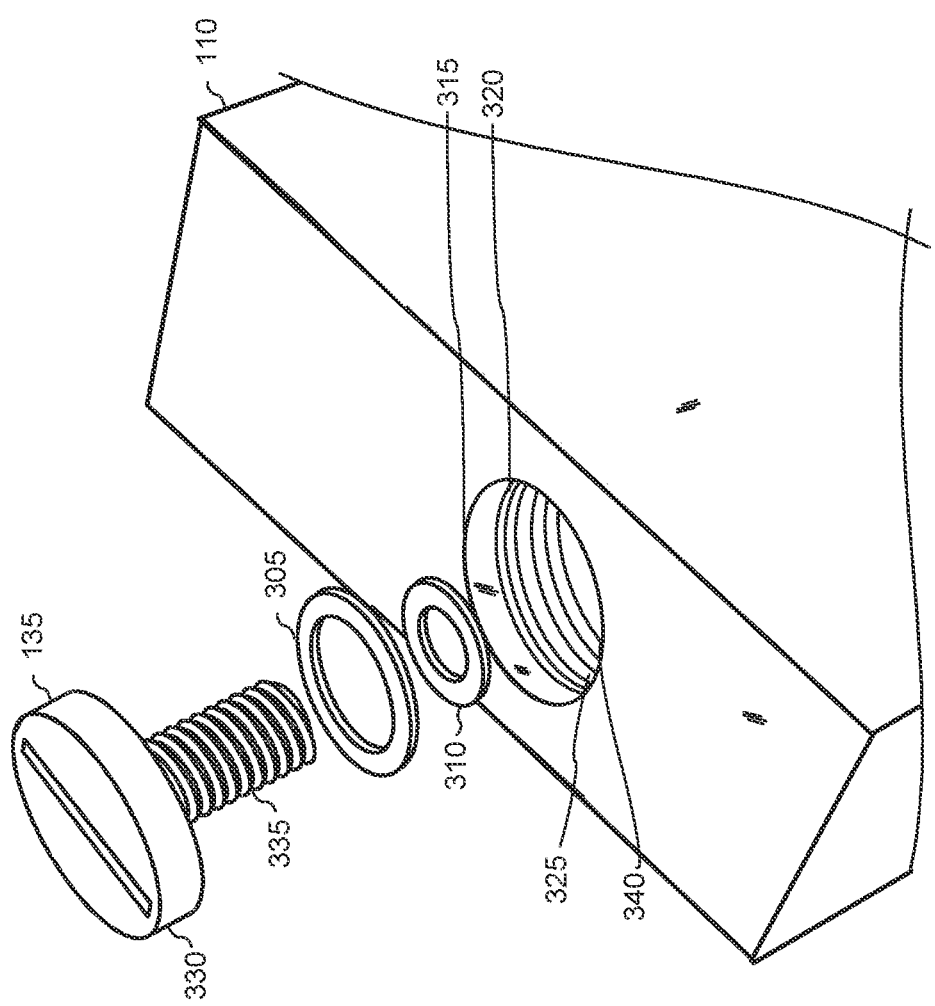
FIG. 3 is a perspective view illustrating a portion of a liquid-tight structure with a fastener component, according to an embodiment of the present disclosure.

FIGS. 2 and 3 show the coolant reservoir 110 which includes a fastener component and seal components. Coolant reservoir 110 is a liquid-tight structure which is also referred to herein as a leak-proof structure or a watertight structure. Coolant reservoir 110 may be included in liquid-based cooler 100 of FIG. 100. Coolant reservoir 110 includes fastener 135, a seal 305, a seal 310, and an opening 315 with multiple stepped portions and a bottom. In this example, opening 315 includes step 320, step 325, and step 340. Fastener 135 includes a head 330 and a threaded shank 335. To form a liquid-tight structure, fastener 135 may be configured to tightly fit in opening 315 with seals 305 and 310, such that the top of fastener 135 is flushed with the top of coolant reservoir 110 and the bottom of threaded shank 335 may be flushed with the bottom of opening 315. Seals 305 and 310 may be compressed against the wall of opening 315 by tightening fastener 135 into the inner surface of coolant reservoir 110 via opening 315 further sealing the gap between the fastener head and the surface and/or interior sides of coolant reservoir 110. Thus, achieving liquid-tight functionality.

Fastener 135 may be a screw, a thumb screw, a step screw, a shoulder screw, a bolt, or any type of connecting member. Fastener 135 may be made of suitable material, such as various metals that include stainless steel, brass, titanium, etc. Fastener 135 may also be made from a plastic material with suitable hardness or strength. In one embodiment, fastener 135 may be a stepped screw that is secured through a screw hole, such as opening 315. Fastener 135 may be a threaded fastener that includes a head 330 and threaded shank 335. Head 330 may be configured such that the top portion may be flushed to the top surface of coolant reservoir 110 when secured through opening 315. Further, head 330 is of a height, wherein the bottom portion of head 330 may be flushed to a grove of opening 315, such as step 320 when tightened. Because of the rigid contact between the head 330 of fastener 135 and opening 315, seals 305 and 310 may not be over-compressed when threaded shank 335 is screwed through opening 315.

Seals 305 and 310 may be configured to provide a liquid-tight feature to fastener 135 preventing coolant from leaking from opening 315. The liquid-tight feature may be a result of a frictional fit between the seals 305 and 310, fastener 135, and/or sides of opening 315. Seals 305 and 310 may be formed with suitable material such as silicone or rubber using a process such as injection molding. In one embodiment, seals 305 and 310 may include O-rings or gaskets of similar shape. Seals 305 and 310 may have a suitable thickness to provide a fluid seal with fastener 135 preventing a fluid or liquid leak. Seal 305 may be configured such that seal 305 is disposed at a groove of opening 315, such as in physical communication with step 320 when fastener 135 is screwed through opening 315. Similarly, seal 310 may be configured such that seal 310 is disposed at a groove of opening 315, such as in physical communication with step 340 when fastener 135 is screwed through opening 315.

Seal 305 may be configured as an exterior seal with a higher hardness than seal 310 which is an interior seal as it is disposed below seal 305. The different hardness of seals 305 and 310 may help avoid the risk of monotonous tolerance. The durometer, also referred to as shore hardness, typically runs numerically from 0-100 with a lower number indicating a softer material and a higher number indicating a harder material. As such, seal 305 may have a higher durometer than seal 310. Accordingly, seal 310 may be a fraction of the durometer of seal 305. In one embodiment, seal 310 may have half the durometer number of seal 305. For example, seal 310 may have a 60A durometer while seal 305 may have a 30A durometer. In another embodiment, seal 310 may have more or less than half the durometer number of seal 305. For example, the durometer value of seal 310 may be a quarter or three-quarters of the value of the durometer of seal 305. The combination of seals 305 and 310 may be configured to fill up space between opening 315 and fastener 135 forming a leak-proof seal and precluding void at a sealing interface.

Figure 4:
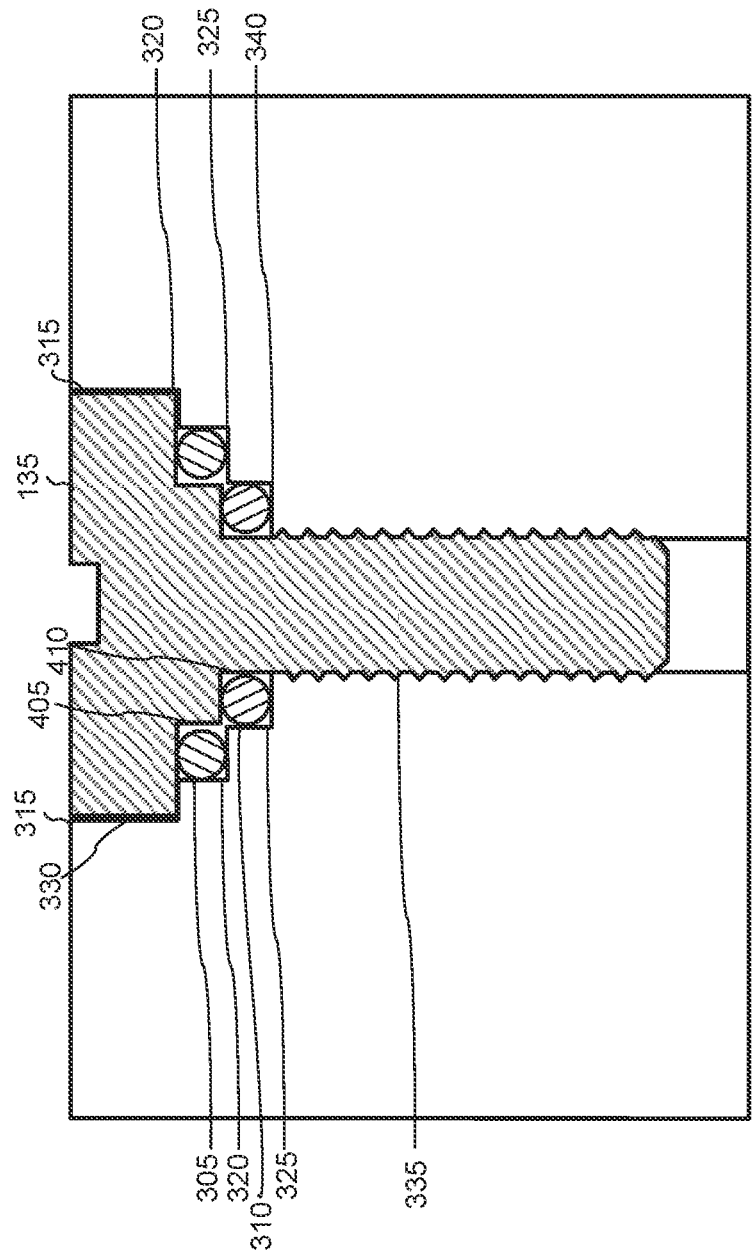
FIG. 4 is a cross-sectional view of a portion of a coolant reservoir taken along line A-A in FIG. 2, according to an embodiment of the present disclosure.

FIG. 4 shows a cross-sectional view of coolant reservoir 110 taken along line A-A as shown in FIG. 2. In this example, coolant reservoir 110 includes fastener 135 that is threadedly engaged and in physical communication with opening 315, wherein fastener 135 may have reached or is about to reach the bottom of opening 315. Fastener 135 includes head 330 which has a diameter that fits in opening 315 such that an outer surface of head 330 is disposed to and in physical communication with side 415 of opening 315, wherein side 415 is the top side of the stepped opening and is disposed or abutted to step 320. Further, a top surface of head 330 is substantially flush with a top surface of coolant reservoir 110 while the bottom portion of head 330 may be seated on and in physical communication with step 320 when fastener 135 is fully threadedly engaged to opening 315.

Fastener 135 also includes an unthreaded shank 405 and threaded shank 335. Unthreaded shank 405 is disposed between head 330 and threaded shank 335, wherein head 330 is above unthreaded shank 405, and wherein threaded shank 335 is below unthreaded shank 405. In one embodiment, a diameter of unthreaded shank 405 is larger than a diameter of threaded shank 335. Also, the diameter of head 330 is larger than the diameter of unthreaded shank 405 and the diameter of threaded shank 335.

Seal 305 may be seated on and in physical communication with step 325 and disposed between unthreaded shank 405 of fastener 135 and side 420 of opening 315 which is disposed to step 325. In particular, seal 305 may be compressed between a side surface of unthreaded shank 405 and side 420 that is abutted to step 325. In addition, seal 305 may also be compressed from the top by the bottom surface of head 330. Seal 305 being compressed from the side, top, and/or bottom may form a leak-tight or liquid-tight seal.

Seal 310 may be disposed between and in physical communication with one side surface of unthreaded shank 410 and a surface of side 425 which is disposed to step 340. In particular, seal 310 may be compressed between another side surface of unthreaded shank 410 and side 425 that is abutted to step 340. In addition, seal 310 may also be compressed from the top by the bottom surface of unthreaded shank 405. Seal 310 being compressed from the side, top, and/or bottom may form a leak-tight or liquid-tight seal. In one embodiment, a diameter of seal 305 is larger than a diameter of seal 310.

The components shown are not drawn to scale and coolant reservoir 110 may include additional or fewer components. In addition, coolant reservoir 110 may not include each of the components shown in FIG. 3 and FIG. 4. Additionally, or alternatively, coolant reservoir 110 may include various additional components in addition to those that are shown in FIG. 2 and FIG. 3. Furthermore, some components that are represented as separate components in FIG. 2 and FIG. 3 may in certain embodiments instead are integrated with other components.

FIG. 5 shows an embodiment of an information handling system 500 including the liquid-based cooler 100. Information handling system 500 further includes processors 502 and 504, a chipset 510, a memory 520, a graphics adapter 530 connected to a video display 534, a non-volatile RAM (NV-RAM) 540 that includes a basic input and output system/extensible firmware interface (BIOS/EFI) module 542, a disk controller 550, a hard disk drive (HDD) 554, an optical disk drive 556, a disk emulator 560 connected to a solid-state drive (SSD) 564, an input/output (I/O) interface 570 connected to an add-on resource 574 and a trusted platform module (TPM) 576, a network interface 580, and a baseboard management controller (BMC) 590. Processor 502 is connected to chipset 510 via processor interface 506, and processor 504 is connected to the chipset via processor interface 508. In a particular embodiment, processors 502 and 504 are connected together via a high-capacity coherent fabric, such as a HyperTransport link, a QuickPath Interconnect, or the like. Chipset 510 represents an integrated circuit or group of integrated circuits that manage the data flow between processors 502 and 504 and the other elements of information handling system 500. In a particular embodiment, chipset 510 represents a pair of integrated circuits, such as a northbridge component and a southbridge component. In another embodiment, some or all of the functions and features of chipset 510 are integrated with one or more of processors 502 and 504.

Memory 520 is connected to chipset 510 via a memory interface 522. An example of memory interface 522 includes a double data rate (DDR) memory channel and memory 520 represents one or more DDR dual in-line memory modules (DIMMs). In a particular embodiment, memory interface 522 represents two or more DDR channels. In another embodiment, one or more of processors 502 and 504 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 520 may further represent various combinations of memory types, such as dynamic random access memory (DRAM) DIMMs, static random access memory (SRAM) DIMMs, non-volatile DIMMs (NV-DIMMs), storage class memory devices, read-only memory (ROM) devices, or the like. Graphics adapter 530 is connected to chipset 510 via a graphics interface 532 and provides a video display output 536 to a video display 534. An example of a graphics interface 532 includes a Peripheral Component Interconnect-Express (PCIe) interface and graphics adapter 530 can include a four-lane (×4) PCIe adapter, an eight-lane (×8) PCIe adapter, a 16-lane (×16) PCIe adapter, or another configuration, as needed or desired. In a particular embodiment, graphics adapter 530 is provided down on a system printed circuit board (PCB). Video display output 536 can include a Digital Video Interface (DVI), a High-Definition Multimedia Interface (HDMI), a DisplayPort interface, or the like, and video display 534 can include a monitor, a smart television, an embedded display such as a laptop computer display, or the like.

NV-RAM 540, disk controller 550, and I/O interface 570 are connected to chipset 510 via an I/O channel 512. An example of I/O channel 512 includes one or more point-to-point PCIe links between chipset 510 and each of NV-RAM 540, disk controller 550, and I/O interface 570. Chipset 510 can also include one or more other I/O interfaces, including a PCIe interface, an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 540 includes BIOS/EFI module 542 that stores machine-executable code (BIOS/EFI code) that operates to detect the resources of information handling system 500, to provide drivers for the resources, to initialize the resources, and to provide common access mechanisms for the resources. The functions and features of BIOS/EFI module 542 will be further described below.

Disk controller 550 includes a disk interface 552 that connects the disc controller to a hard disk drive (HDD) 554, to an optical disk drive (ODD) 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an institute of electrical and electronics engineers (IEEE) 1394 (Firewire) interface, a proprietary interface, or a combination thereof. Alternatively, SSD 564 can be disposed within information handling system 500.

I/O interface 570 includes a peripheral interface 572 that connects the I/O interface to add-on resource 574, to TPM 576, and to network interface 580. Peripheral interface 572 can be the same type of interface as I/O channel 512 or can be a different type of interface. As such, I/O interface 570 extends the capacity of I/O channel 512 when peripheral interface 572 and the I/O channel are of the same type, and the I/O interface translates information from a format suitable to the I/O channel to a format suitable to the peripheral interface 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a network communication device disposed within information handling system 500, on a main circuit board of the information handling system, integrated onto another component such as chipset 510, in another suitable location, or a combination thereof. Network interface 580 includes a network channel 582 that provides an interface to devices that are external to information handling system 500. In a particular embodiment, network channel 582 is of a different type than peripheral interface 572, and network interface 580 translates information from a format suitable to the peripheral channel to a format suitable to external devices.

In a particular embodiment, network interface 580 includes a NIC or host bus adapter (HBA), and an example of network channel 582 includes an InfiniBand channel, a Fibre Channel, a Gigabit Ethernet channel, a proprietary channel architecture, or a combination thereof. In another embodiment, network interface 580 includes a wireless communication interface, and network channel 582 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 582 can be connected to an external network resource (not illustrated). The network resource can include another information handling system, a data storage system, another network, a grid management system, another suitable resource, or a combination thereof.

BMC 590 is connected to multiple elements of information handling system 500 via one or more management interface 592 to provide out of band monitoring, maintenance, and control of the elements of the information handling system. As such, BMC 590 represents a processing device different from processor 502 and processor 504, which provides various management functions for information handling system 500. For example, BMC 590 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 590 can vary considerably based on the type of information handling system. BMC 590 can operate in accordance with an Intelligent Platform Management Interface (IPMI). Examples of BMC 590 include an Integrated Dell R Remote Access Controller (iDRAC).

Management interface 592 represents one or more out-of-band communication interfaces between BMC 590 and the elements of information handling system 500, and can include an Inter-Integrated Circuit ($I^2C$) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 500, that is apart from the execution of code by processors 502 and 504 and procedures that are implemented on the information handling system in response to the executed code.

BMC 590 operates to monitor and maintain system firmware, such as code stored in BIOS/EFI module 542, option ROMs for graphics adapter 530, disk controller 550, add-on resource 574, network interface 580, or other elements of information handling system 500, as needed or desired. In particular, BMC 590 includes a network interface 594 that can be connected to a remote management system to receive firmware updates, as needed or desired. Here, BMC 590 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 590 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 590, an interface defined by the Distributed Management Taskforce (DMTF) (such as a Web Services Management (WSMan) interface, a Management Component Transport Protocol (MCTP) or, a Redfish® interface), various vendor defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 590 is included on a main circuit board (such as a baseboard, a motherboard, or any combination thereof) of information handling system 500 or is integrated onto another element of the information handling system such as chipset 510, or another suitable element, as needed or desired. As such, BMC 590 can be part of an integrated circuit or a chipset within information handling system 500. An example of BMC 590 includes an iDRAC, or the like. BMC 590 may operate on a separate power plane from other resources in information handling system 500. Thus, BMC 590 can communicate with the management system via network interface 594 while the resources of information handling system 500 are powered off. Here, information can be sent from the management system to BMC 590 and the information can be stored in a RAM or NV-RAM associated with the BMC. Information stored in the RAM may be lost after power-down of the power plane for BMC 590, while information stored in the NV-RAM may be saved through a power-down/power-up cycle of the power plane for the BMC.

Information handling system 500 can include additional components and additional busses, not shown for clarity. For example, information handling system 500 can include multiple processor cores, audio devices, and the like. While a particular arrangement of bus technologies and interconnections is illustrated for the purpose of example, one of skill will appreciate that the techniques disclosed herein are applicable to other system architectures. Information handling system 500 can include multiple central processing units (CPUs) and redundant bus controllers. One or more components can be integrated together. Information handling system 500 can include additional buses and bus protocols, for example, I²C and the like. Additional components of information handling system 500 can include one or more storage devices that can store machine-executable code, one or more communications ports for communicating with external devices, and various input and output (I/O) devices, such as a keyboard, a mouse, and a video display.

For purposes of this disclosure information handling system 500 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 500 can include processing resources for executing machine-executable code, such as processor 502, a programmable logic array (PLA), an embedded device such as a System-on-a-Chip (SoC), or other control logic hardware. Information handling system 500 can also include one or more computer-readable media for storing machine-executable code, such as software or data.

Although the present disclosure has been described in detail, it should be understood that various changes, substitutions, and alterations can be made hereto without departing from the spirit and scope of the disclosure as defined by the appended claims.

What is claimed is:

1. A liquid-tight structure comprising:
   a stepped screw that includes a first shank and a second shank, the stepped screw is screwed in a screw hole that includes a first step and a second step, wherein a first diameter of the first shank is larger than a second diameter of the second shank, wherein the stepped screw further includes a head, and wherein a bottom portion of the head is seated on a third step of the screw hole;
   a first O-ring seated on and in physical communication with a first top surface of the first step of the screw hole, wherein the first O-ring is compressed between a first side of the screw hole and the first shank forming a first seal; and
   a second O-ring seated on and in physical communication with a second top surface of the second step of the screw hole, wherein the second O-ring is compressed between a second side of the screw hole and the second shank.

2. The liquid-tight structure of claim 1, wherein the second shank is a threaded shank.

3. The liquid-tight structure of claim 1, wherein the first O-ring and the second O-ring are liquid-tight.

4. The liquid-tight structure of claim 1, wherein the liquid-tight structure is used in a liquid-based cooler.

5. The liquid-tight structure of claim 1, wherein the first side of the screw hole is abutted to the first step.

6. The liquid-tight structure of claim 1, wherein the second side of the screw hole is abutted to the second step.

7. The liquid-tight structure of claim 1, wherein the first O-ring has a higher shore hardness than the second O-ring.

8. The liquid-tight structure of claim 1, wherein diameter of the head is greater than the first shank.

9. The liquid-tight structure of claim 1, wherein a top portion of the head is flushed with a top surface of the liquid-tight structure.

10. An information handling system with a liquid cooling system comprising:
    a stepped screw that includes a first shank and a second shank, wherein the stepped screw is screwed into a screw hole that includes a first step and a second step, wherein a first diameter of the first shank is larger than a second diameter of the second shank, wherein the stepped screw further includes a head, and wherein a bottom portion of the head is seated on a third step of the screw hole;
    a first O-ring seated on and in physical communication with a first top surface of the first step of the screw hole, wherein the first O-ring is compressed between a first side of the screw hole and the first shank forming a first seal; and
    a second O-ring seated on and in physical communication with a second top surface of the second step of the screw hole, wherein the second O-ring is compressed between a second side of the screw hole and the second shank forming a second seal.

11. The information handling system of claim 10, wherein the stepped screw further includes a threaded shank.

12. The information handling system of claim 10, wherein the first side of the screw hole is abutted to the first step.

13. The information handling system of claim 10, wherein the second side of the screw hole is abutted to the second step.

14. The information handling system of claim 10, wherein the first O-ring has a higher shore hardness than the second O-ring.

15. The information handling system of claim 14, wherein the second shank is threaded.

16. A leak-proof structure comprising:
- a stepped screw that includes a first shank and a second shank, the stepped screw is screwed into a screw hole that includes a first step and a second step, wherein a first diameter of the first shank is larger than a second diameter of the second shank, wherein the stepped screw further includes a head, and wherein a bottom portion of the head is seated on a third step of the screw hole;
- a first O-ring seated on and in physical communication with a first top surface of the first step of the screw hole, wherein the first O-ring is compressed between a first side of the screw hole and the first shank forming a first seal; and
- a second O-ring seated on and in physical communication with a second top surface of the second step of the screw hole, wherein the second O-ring is compressed between a second side of the screw hole and the second shank forming a second seal and wherein the first seal has a higher shore hardness than the second seal.

17. The leak-proof structure of claim 16, wherein the leak-proof structure is used for storing coolant for a liquid-based cooler of an information handling system.

18. The leak-proof structure of claim 16, wherein the first shank is an unthreaded shank.

19. The leak-proof structure of claim 16, wherein the first side of the screw hole is abutted to the first step.

20. The leak-proof structure of claim 16, wherein the second side of the screw hole is abutted to the second step.

* * * * *